United States Patent
Douglas

[11] Patent Number: 5,565,179
[45] Date of Patent: Oct. 15, 1996

[54] ELECTROSTATIC PARTICLE REMOVAL AND CHARACTERIZATION

[75] Inventor: Monte A. Douglas, Coppell, Tex.

[73] Assignee: Texas Instruments Incorporated, Dallas, Tex.

[21] Appl. No.: 473,457

[22] Filed: Jun. 7, 1995

Related U.S. Application Data

[62] Division of Ser. No. 166,321, Dec. 10, 1993.

[51] Int. Cl.$^6$ .............................. B01J 19/08; B01J 19/12; C23C 14/22; C23C 14/28
[52] U.S. Cl. .................... 422/186.05; 422/906; 118/722
[58] Field of Search ........................... 422/186.05, 906; 118/722

[56] References Cited

U.S. PATENT DOCUMENTS

| | | | |
|---|---|---|---|
| 4,253,907 | 3/1981 | Parry et al. | 156/643 |
| 4,264,393 | 4/1981 | Gorin et al. | 156/345 |
| 4,292,153 | 9/1981 | Kudo et al. | 204/164 |
| 4,333,814 | 6/1982 | Küyel | 204/298 |
| 4,664,767 | 5/1987 | Kudo et al. | 204/164 |
| 4,915,917 | 4/1990 | Pollard et al. | 422/186.05 |
| 4,990,229 | 2/1991 | Campbell et al. | 204/298.06 |
| 5,022,979 | 6/1991 | Hijikata et al. | 204/298.33 |
| 5,031,571 | 7/1991 | Igarashi et al. | 118/723 |
| 5,156,820 | 10/1992 | Wong et al. | 422/186.05 |
| 5,185,132 | 2/1993 | Horiike et al. | 422/186.05 |

*Primary Examiner*—Charles T. Jordan
*Assistant Examiner*—Daniel Jenkins
*Attorney, Agent, or Firm*—Christopher L. Maginniss; James C. Kesterson; Richard L. Donaldson

[57] ABSTRACT

An electrostatic decontamination method and decontamination device (10) is disclosed for decontaminating the surface of a semiconductor substrate. The decontamination device (10) includes particle ionizing device (24) that charges contaminating particles (26) on the surface of semiconductor substrate (16) thereby creating ionized particles. Decontamination device (10) also includes substrate biasing device (12) for creating a charge accumulation layer (14) at the top of semiconductor substrate (16) so that the charge accumulation layer (14) has the same charge sign as the ionized particles. In addition, the invention analytically characterizes particles using contaminating particle isolator (44) which contains a particle ionizing device (24) that charges contaminating particles (26) on the surface of semiconductor substrate (16) thereby creating ionized particles. Contaminating particle isolator (44) includes substrate biasing device (12) operable to create charge accumulation layer (14) at the top of semiconductor substrate (16) so that the charge accumulation layer (14) has the same charge sign as the ionized particles. Contaminating particle isolator (44) also includes particle collector (46) that collects the ionized particles. This permits characterizing the particles to determine their chemical composition.

12 Claims, 3 Drawing Sheets

ELECTROSTATIC PARTICLE REMOVAL AND CHARACTERIZATION

This is a division, of application Ser. No. 08/166,321, filed Dec. 10, 1993, now allowed.

TECHNICAL FIELD OF THE INVENTION

This invention relates generally to semiconductor device fabrication, and more particularly, to a method and apparatus for electrostatically decontaminating the surface of a semiconductor substrate.

BACKGROUND OF THE INVENTION

The need to remove contaminating particles from semiconductor surfaces during the fabrication process has grown increasingly important as the size of semiconductor devices decreases. In an attempt to conquer this problem, manufacturers of semiconductors have employed two major techniques. A first group of manufacturers considers it impossible to remove particles once they attach to a surface, especially as the particles and level of integration reach submicron sizes. To solve the contamination problem, this group of manufacturers advocates taking preemptive actions to preclude contamination in the first place. A second group of manufacturers accepts the reality of contamination and advocates reducing contamination through the use of particle removal techniques.

Members of both groups currently use methods that suffer from serious deficiencies. As engineers continue to develop smaller, submicron-sized devices, the significance of submicron-sized contamination particles increases. For those in the first group of manufacturers, existing technology becomes less efficient as the contaminating particle size decreases. First, it becomes more and more difficult to design clean rooms and equipment that will prevent submicron-sized contamination particles from reaching the surface of a substrate. Second, existing techniques for characterizing contaminating particles are often ineffective for particles in the submicron range. Existing probes do not have a fine enough resolution to isolate contaminating particles of this size. Without an effective technique for characterization, manufacturers cannot identify the source of contamination. As a result, manufacturers have great difficulty eliminating these unknown contamination sources.

Those techniques used by members of the second group of manufacturers also have their failings. One popular technique employs brush scrubbing with water or isopropyl alcohol. This technique is ineffective even for micron-sized particles as it is nearly impossible to make a brush capable of reaching every micron of a surface even when used with a liquid.

Others in the second group of manufacturers advocate the use of high energy irradiation to remove particles. This controversial technique has not been proven effective and also risks damaging the substrate.

Members of the second group of manufacturers most commonly use a liquid surfactant solution for particle removal. When using this technique, a substrate is immersed in surfactant and the solution is normally agitated with a transducer operating at high frequencies. Liquid particle removal, however, suffers from several disadvantages. The efficiency of the technique decreases as the size of the contaminating particles decreases, making this process of decreasing importance for current and future generations of semiconductor processing. Current techniques are, at best, normally only effective for particles of micron size or larger. Liquid decontamination techniques are normally ineffective at the submicron level because the agitation created in the liquid frequently causes a boundary layer to develop on the surface with a thickness of approximately 0.2 to 0.3 microns. The boundary layer in the liquid prevents particles of this size, or smaller, from being affected by the turbulence created in the liquid. In addition, the liquids used for decontamination can actually cause contamination of the substrate. In particular, these liquids can leave both particulate and metallic contamination on the substrate. Chemicals also tend to be expensive to purchase and to dispose of.

SUMMARY OF THE INVENTION

Therefore, a need has arisen for a way to decontaminate semiconductor surfaces that avoids the use of chemicals and effectively removes particles smaller than one micron. In addition, a need has arisen for a technique for characterizing submicron-sized particles that allows accurate identification of these particles.

In accordance with the present invention, a method and apparatus is provided that substantially eliminates or reduces disadvantages and problems associated with prior methods and apparatus for decontaminating semiconductor surfaces. In particular, a method for electrostatically decontaminating the surface of a semiconductor substrate is provided wherein contaminating particles on the semiconductor substrate are ionized to produce ionized particles. Also, the semiconductor substrate is biased to produce a charge accumulation layer at the top of the substrate, the layer having the same charge sign as the ionized particles. Accordingly, contaminated particles become electrostatically separated from the semiconductor surface.

An important technical advantage of the present invention is that it allows for the removal of particles much smaller than one micron. The invention is also a dry process, eliminating the need to purchase and dispose of expensive chemicals. Moreover, the invention eliminates the need to expose humans to hazardous chemicals in particle decontamination operations. The disclosed invention also allows particle removal without the risk of further contamination of the surface or the semiconductor material itself. Particles can be removed at a lower cost using the disclosed invention. The invention also allows easy collection of submicron-sized particles for characterization. Consequently, the disclosed invention solves many of the problems with currently used methods and provides a decontamination method attractive to both groups of manufacturers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to the FIGS. 1–6, like numerals being used for like and corresponding parts of the various drawings.

Figure 1:
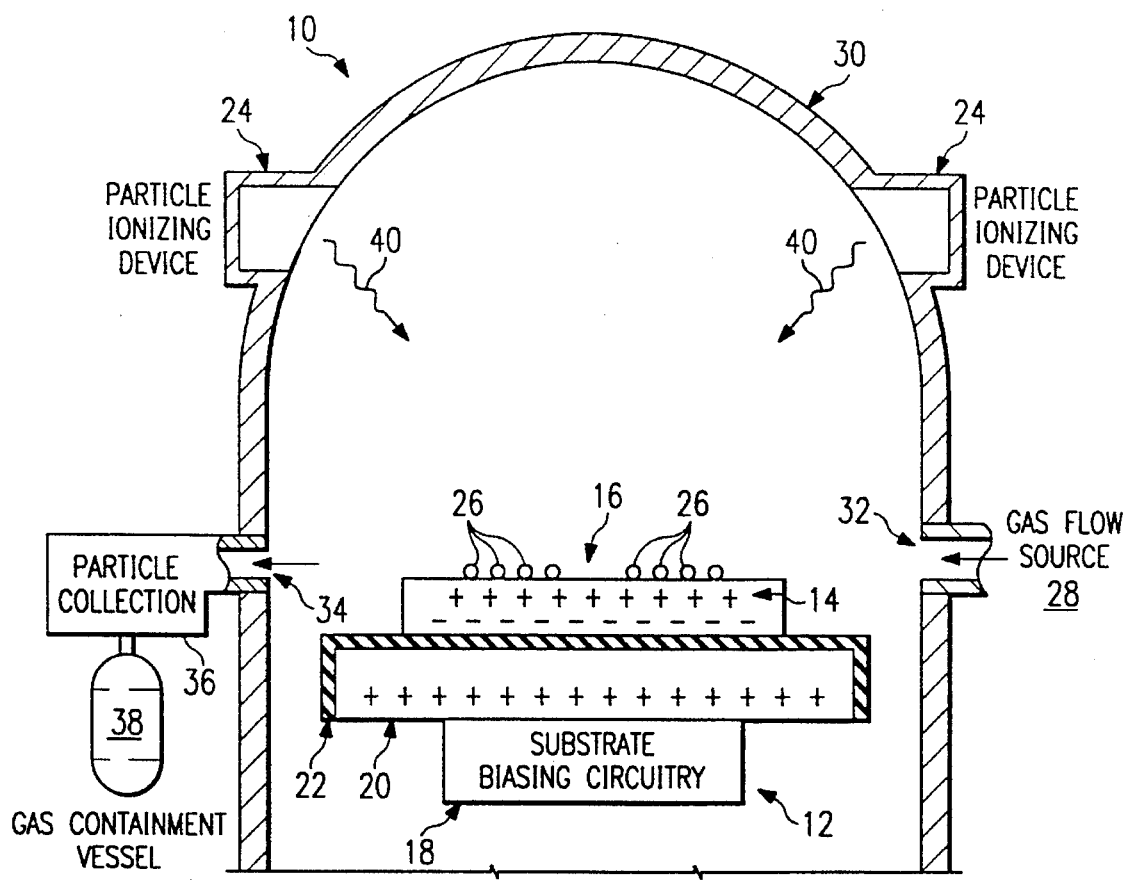
FIG. 1 illustrates one embodiment of an apparatus for electrostatically decontaminating a semiconductor surface made in accordance with the teachings of the present invention.

FIG. 1 illustrates one embodiment of a decontamination device, indicated generally at 10, for electrostatically decontaminating the surface of a semiconductor substrate in accordance with the teachings of the present invention. Decontamination device 10 includes substrate biasing device 12, that creates a charge accumulation layer 14 at the top of semiconductor substrate 16. In this embodiment, substrate biasing device 12 consists of substrate biasing circuitry 18 that connects to wafer chuck 20. Wafer chuck 20 includes insulating layer 22.

Decontamination device 10 further includes one or more particle ionizing devices 24 that are operable to charge contaminating particles 26 so that the contaminating particles have the same charge sign as does charge accumulation layer 14. In the FIG. 1 embodiment, particle ionizing devices 24 include a source of deep ultraviolet light or radiation. One particle ionizing device 24 could also be used instead of multiple particle ionizing devices. For most decontamination operations, a low energy source of deep ultraviolet light suffices. The position of particle ionizing devices 24 relative to the semiconductor substrate 16 is unimportant, provided that the deep ultraviolet photons that particle ionizing devices 24 give off reach semiconductor substrate 16.

To aid in removing particles, this embodiment also includes gas flow source 28 that supplies a moving flow of gas over the surface of semiconductor substrate 16. Gas flow source 28 supplies a gas that is inert to semiconductor substrate 16. Any gas inert to the substrate can be used such as electronics grade helium or argon. The gas flow source may also include a filtering mechanism (not shown) capable of removing particles of the magnitude 0.1 microns or smaller.

This embodiment of decontamination device 10 also includes containment vessel 30 which prevents further contamination of semiconductor substrate 16. Containment vessel 30 includes one or more gas flow input openings 32 and gas flow output openings 34. Gas flow input opening 32 allows gas supplied from gas flow source 28 to flow into containment vessel 30 and across the surface of semiconductor substrate 16. The gas then flows out of containment vessel 30 through gas flow output opening 34. Particle collection vessel 36 connects to gas flow output opening 34 and collects particulate contaminants. Many suitable methods for collecting contaminated particles can be used including filtration and electrostatic collection. Particle collection vessel 36 also connects to used gas containment vessel 38 which collects gas that has passed through containment vessel 30 and over the surface of semiconductor substrate 16. If suitable filtering apparatus is available, the used gas can be recycled and sent back to the gas flow source.

The operation of the decontamination device 10 is as follows. First, it is necessary to apply a bias to semiconductor substrate 16 in order to create charge accumulation layer 14. In the illustrated embodiment, the substrate biasing circuitry 18 creates a positive bias on wafer chuck 20, which is insulated by insulating layer 22. The positive bias on wafer chuck 20 causes positive charge accumulation layer 14 to form at the top of semiconductor substrate 16. This charge accumulation layer appears at the surface as well as below the surface at the top of semiconductor substrate 16.

Particle ionizing device 24 then charges contaminating particles 26 with the same charge sign as charge accumulation layer 14. Here, contaminating particles 26 must be positively charged. Accordingly, this embodiment uses a source of deep ultraviolet light for a particle ionizing device 24. The order of these steps is unimportant for this embodiment. The particles could be charged before forming the charge accumulation layer.

Figure 2:
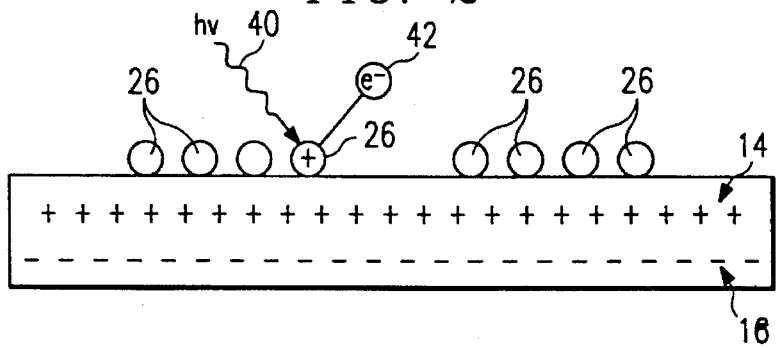
FIG. 2 illustrates the operation of the electrostatic decontamination apparatus shown in FIG. 1.

As FIG. 2 illustrates, a deep ultraviolet photon 40 strikes contaminating particle 26, causing the contaminating particle 26 to release an electron 42. The release of electron 42 makes the contaminating particle a positively charged ion. Because charge accumulation layer 14 also has positive charge, the charged contamination particle electrostatically separates from the surface of semiconductor substrate 16. Such electrostatic equivalent charge rejection is sufficient to both counter any charge attracting the contaminating particle to the substrate and to repel the particle from the substrate.

Figure 3:
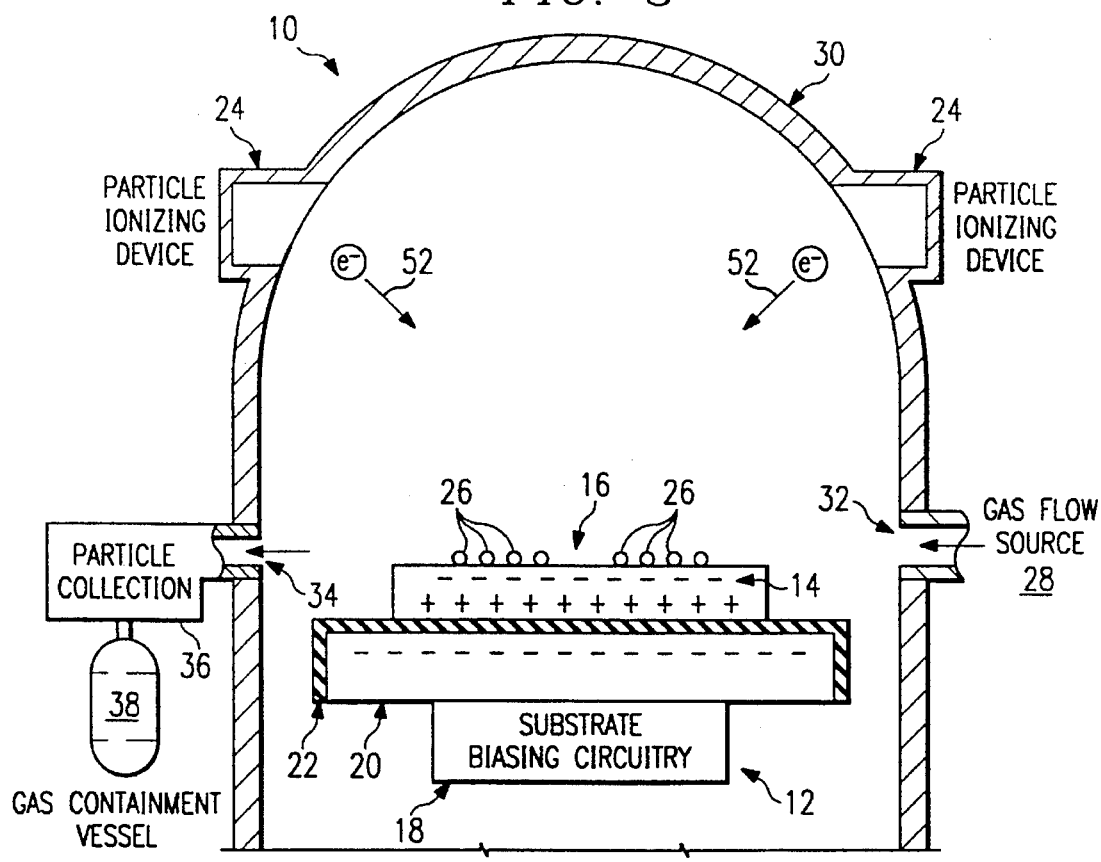
FIG. 3 illustrates one embodiment of a electrostatic decontamination device made in accordance with the teachings of the present invention.

FIG. 3 illustrates another embodiment of decontamination device 10 for electrostatically decontaminating the surface of a semiconductor substrate made in accordance with the teachings of the present invention. The structure and operation of this embodiment is similar to the embodiment that FIG. 1 illustrates. Here, however, substrate biasing circuitry 18 creates a negative bias on wafer chuck 20. The negative bias on wafer chuck 20, in turn, makes charge accumulation layer 14 negative.

Because the charge accumulation layer in the embodiment illustrated in FIG. 3 is negative, the particle ionizing device 24 must convert the contaminating particles 26 into negatively charged ions. Accordingly, in the embodiment illustrated in FIG. 3, particle ionizing devices 24 consist of a source of a low energy, broad area flux of electrons. In this embodiment, the contaminating particles should be charged prior to forming the charge accumulation layer because the charge accumulation layer will deflect the flux of electrons. Alternatively, a method of negatively ionizing the particles could be used that does not require an electron flux, possibly making the order of the steps unimportant. An AC bias could also be applied to semiconductor substrate 16, making the order of the steps unimportant.

Figure 4:
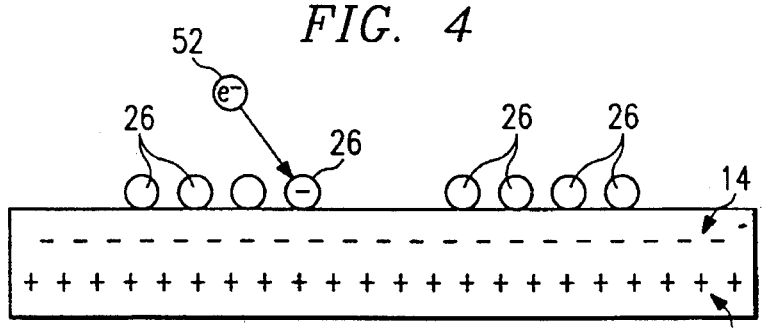
FIG. 4 illustrates the operation of the decontamination device shown in FIG. 3.

FIG. 4 illustrates more clearly the operation of the embodiment illustrated in FIG. 3. Electron 52 strikes one of the contaminating particles 26 on the surface of semiconductor substrate 16. The contaminating particle 26 in question absorbs electron 52, thus forming a negatively charged particle, or anion. After anions have been formed, substrate biasing circuitry 18 creates a negative charge accumulation layer at the top of semiconductor substrate 16. Because charge accumulation layer 14 has a negative charge, the negatively charged contaminating particle electrostatically repels from the surface of semiconductor substrate 16.

An advantage of the embodiments illustrated in FIGS. 1 and 3 is that they do not use expensive electronics grade liquids. These embodiments allow easy removal of submicron-sized particles without the risk of further contamination. In addition, the disclosed technique allows removal of particles smaller than could be removed using currently available particle removal techniques.

The embodiments of the decontamination devices illustrated in FIGS. 1 and 3 use a DC bias on the substrate biasing device to set up the charge accumulation layer at the top of the semiconductor substrate. Where semiconductors include multiple layers, an AC voltage could be used as an alternative to cause both positive and negative charge accumulation to occur at the semiconductor surface. The disclosed decontamination device also has use as one module in a cluster tool.

Figure 5:
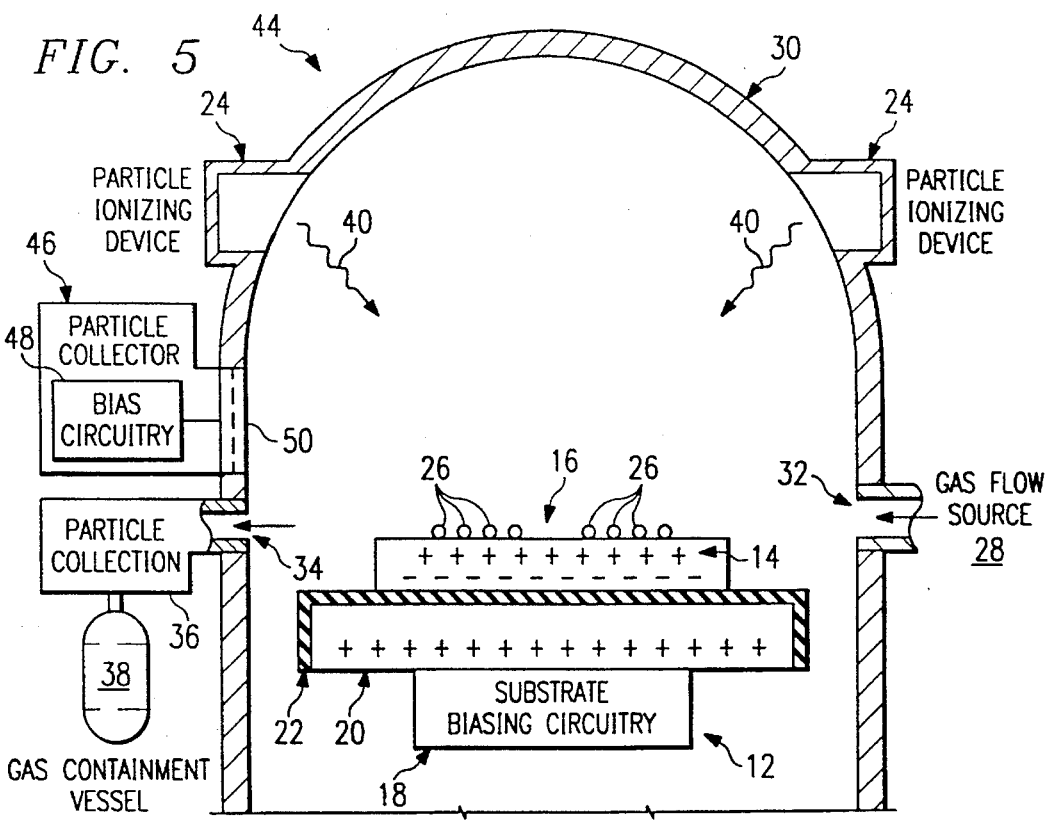
FIG. 5 shows one embodiment of a contaminating particle isolator made in accordance with the teachings of the present invention.

FIG. 5 illustrates contaminating particle isolator 44 for collecting contaminating particles from a semiconductor substrate. The FIG. 5 embodiment has a structure similar to decontamination device 10 illustrated in FIG. 1. The contaminating particle isolator, however, includes particle collector 46 that collects the charged contaminating particles which have been electrostatically repelled from surface of semiconductor substrate 16. Particle collector 46 consists of particle collector bias circuitry 48 that connects to electrode 50. Electrode 50 can be positioned in a number of locations inside containment vessel 30 of the contaminating particle isolator 44 or inside particle collection vessel 36.

Particle collector bias circuitry 48 may be constructed of any type of circuitry operable to create a charge bias on electrode 50. Electrode 50 consists of any material capable of maintaining a charge accumulation. For example, electrode 50 could consist of a piece of semiconductor material.

In the FIG. 5 embodiment, particle collector bias circuitry 48 induces a negative charge accumulation on electrode 50. Charged contaminating particles repel from the surface of semiconductor substrate 16 as FIGS. 1 and 2 describe above. Positively charged particles that have been electrostatically repelled from the surface of semiconductor substrate 16 can now be collected through the use of electrostatic attraction on the surface of electrode 50.

After the particles have been collected on the surface of electrode 50, they may be characterized using any known method of characterization. Some currently used methods include time-of-flight secondary ion mass spectrometry (TOFSIMS) and x-ray photoelectron spectrometry (XPS).

An advantage of the contaminating particle isolator of the present embodiment is that many submicron-sized contaminating particles can be collected on electrode 50. Because a large number of particles can be collected in one place, existing characterization techniques can be used. The size of the probe used for the characterization technique becomes much less important. In existing characterization techniques, the probe is applied to the substrate surface. Because the surface includes many particles larger than the submicron sized particles, the probe usually will not identify the submicron-sized particles. Rather than attempting to characterize a submicron particle many times smaller than surrounding particles that will also be detected by the probe, the current invention allows the probe to characterize a large quantity of contaminating particles. Presumably, many of the submicron-sized contaminating particles will have similar chemical composition. This allows existing characterization techniques to identify a contaminant where none could be identified before.

Figure 6:
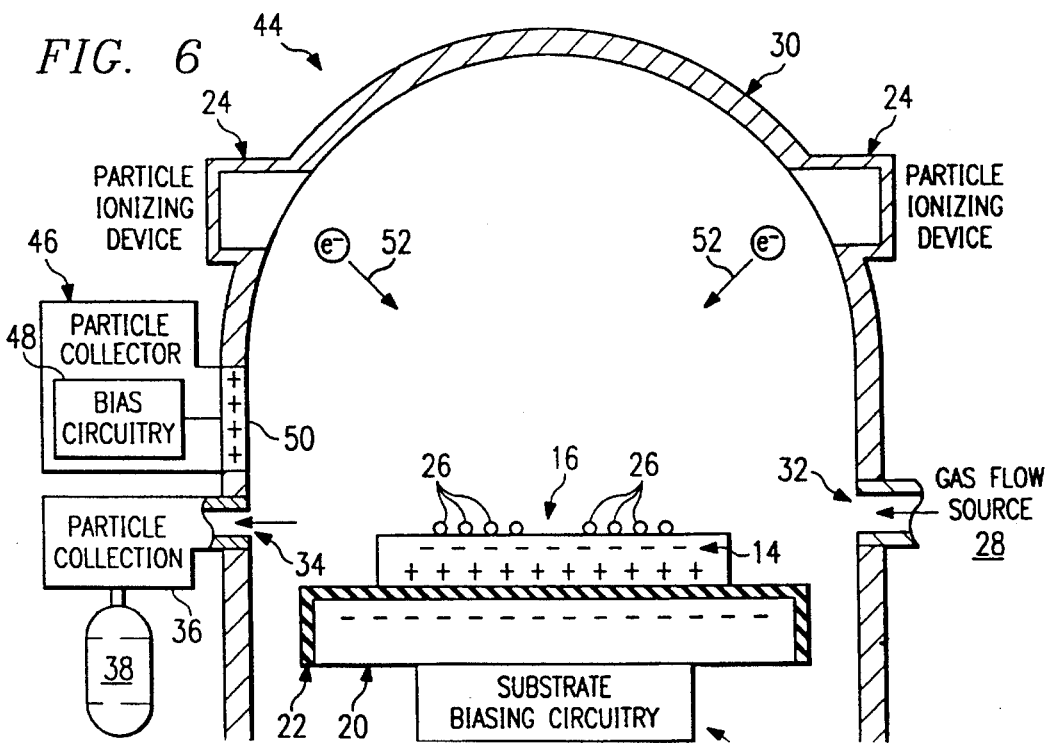
FIG. 6 shows one embodiment of a contaminating particle isolator made in accordance with the teachings of the present invention.

The embodiment of contaminating particle isolator 44 that FIG. 6 shows has structure similar to the decontamination device 10 of FIG. 3. In addition, particle collector 46 and its components are similar to the contaminating particle isolator that FIG. 5 shows.

In FIG. 6, particle collector bias circuitry 48 induces a positive charge accumulation on electrode 50. Negatively charged contaminating particles repel from the surface of semiconductor substrate 16 as FIGS. 3 and 4 describe above. Charged particles that have been electrostatically repelled from the surface of semiconductor substrate 16 can now be collected through the use of electrostatic attraction on the surface of electrode 50. These collected particles can also be characterized by methods such as TOFSIMS or XPS.

This detailed description of the invention has thus disclosed a method for electrostatically decontaminating the surface of a semiconductor substrate. The contaminating particles on the semiconductor substrate are ionized to produce ionized particles. The surface of the semiconductor substrate is biased to produce a charge accumulation layer at the top of the substrate having the same charge sign as the ionized particles. Accordingly, contaminated particles become electrostatically separated from the semiconductor surface.

In addition, a method for analytically characterizing particles contaminating a semiconductor substrate has been described. In accordance with this method, contaminating particles on the semiconductor substrate are ionized to produce ionized particles. The semiconductor substrate is biased to produce a charge accumulation layer at the top of the substrate having the same charge sign as the ionized particles. These particles then become electrostatically separated from the semiconductor surface. The method then employs a charged particle collector having a charge sign opposite to that of the ejected particles in order to electrostatically collect the ionized particles. The chemical composition of the collected ionized particles may then be determined.

Although the present invention and its advantages have been described in detail, it should be understood that various changes, substitutions and alterations can be made therein without departing from the spirit and scope of the invention as defined by the appended claims.

What is claimed is:

1. A decontamination device for electrostatically decontaminating the surface of a semiconductor substrate having contaminating particles thereon comprising:

a substrate biasing device operable to create a charge accumulation layer at the top of the semiconductor substrate;

a particle ionizing device operable to charge the contaminating particles thereby forming ionized particles having the same charge sign as the charge accumulation layer.

2. The decontamination device of claim 1 wherein said substrate biasing device comprises a wafer chuck.

3. The decontamination device of claim 1 wherein said particle ionizing device comprises a source of deep ultraviolet light.

4. The decontamination device of claim 1 and further comprising a gas flow source operable to supply a moving flow of gas inert to the semiconductor substrate over the surface of the semiconductor substrate.

5. The decontamination device of claim 1 wherein said particle ionizing device comprises a source of a low energy, broad area flux of electrons.

6. The decontamination device of claim 1 wherein said substrate biasing device comprises a wafer chuck and said particle ionizing device comprises a source of deep ultraviolet light.

7. The decontamination device of claim 1 wherein said substrate biasing device comprises a wafer chuck and said particle ionizing device comprises a source of a low energy, broad area flux of electrons.

8. A contaminating particle isolator for collecting contaminating particles from a semiconductor substrate comprising:

a substrate biasing device operable to create a charge accumulation layer at the top of the semiconductor substrate;

a particle ionizing device operable to charge the contaminating particles, thereby forming ionized particles having the same charge sign as the charge accumulation layer; and a particle collector operable to collect the ionized particles.

9. The contaminating particle isolator of claim 8 wherein said particle collector comprises a charged electrode containing a charge with a charge sign opposite to that of the ionized particles.

10. The contaminating particle isolator of claim 8 and further comprising:

a gas flow source operable to supply a moving flow of a gas inert to the semiconductor over the surface of the semiconductor substrate.

11. The contaminating particle isolator of claim 8 wherein said substrate biasing device comprises an insulated wafer chuck;

said particle ionizing device comprises a source of deep ultraviolet light; and said particle collector comprises a charged electrode containing a charge with a charge sign opposite to that of the ionized particles.

12. The contaminating particle isolator of claim 8 wherein said substrate biasing device comprises an insulated wafer chuck;

said particle ionizing device comprises a source of a low energy, broad area flux of electrons; and said particle collector comprises a charged electrode containing a charge with a charge sign opposite to that of the ionized particles.

* * * * *